US010095582B2

United States Patent
Dhuse et al.

(10) Patent No.: US 10,095,582 B2
(45) Date of Patent: Oct. 9, 2018

(54) PARTIAL REBUILDING TECHNIQUES IN A DISPERSED STORAGE UNIT

(71) Applicant: International Business Machines Corporation, Armonk, NY (US)

(72) Inventors: Greg R. Dhuse, Chicago, IL (US); Trevor J. Vossberg, Chicago, IL (US); Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/846,880

(22) Filed: Dec. 19, 2017

(65) Prior Publication Data
US 2018/0107554 A1     Apr. 19, 2018

Related U.S. Application Data

(63) Continuation-in-part of application No. 14/847,855, filed on Sep. 8, 2015, now Pat. No. 9,916,114.
(Continued)

(51) Int. Cl.
*G06F 12/00* (2006.01)
*G06F 13/00* (2006.01)
(Continued)

(52) U.S. Cl.
CPC .......... *G06F 11/1092* (2013.01); *G06F 3/064* (2013.01); *G06F 3/067* (2013.01);
(Continued)

(58) Field of Classification Search
CPC .... G06F 11/1092; G06F 3/0619; G06F 3/064; G06F 3/067; G06F 9/30029;
(Continued)

(56) References Cited

U.S. PATENT DOCUMENTS 4,092,732 A     5/1978   Ouchi
5,454,101 A     9/1995   Mackay et al.
(Continued)

OTHER PUBLICATIONS

Chung; An Automatic Data Segmentation Method for 3D Measured Data Points; National Taiwan University; pp. 1-8; 1998.
(Continued)

*Primary Examiner* — Sheng-Jen Tsai
(74) *Attorney, Agent, or Firm* — Garlick & Markison; Timothy W. Markison; Harry S. Tyson, Jr.

(57) ABSTRACT

Methods for use in a dispersed storage network (DSN) to rebuild data. In various examples, at least one data segment of a data object is dispersed storage error encoded to produce a set of encoded data slices that includes an information dispersal algorithm (IDA) width number of encoded data slices, wherein the IDA width number is at least twice the number of storage units of a set of storage units utilized to store the data object. At least two encoded data slices are stored in each of the storage units. In response to detecting a storage error indicating an error slice, a partial threshold number of partial encoded data slices (generated by performing a partial encoding function on stored encoded data slices) are generated. The partial threshold number of partial encoded data slice responses are combined to produce a rebuilt encoded data slice corresponding to the error slice.

20 Claims, 7 Drawing Sheets

Related U.S. Application Data

(60) Provisional application No. 62/072,123, filed on Oct. 29, 2014.

(51) Int. Cl.

| | | |
|---|---|---|
| *G06F 13/28* | (2006.01) | |
| *G06F 11/10* | (2006.01) | |
| *G06F 11/14* | (2006.01) | |
| *H03M 13/15* | (2006.01) | |
| *H03M 13/11* | (2006.01) | |
| *G06F 9/30* | (2018.01) | |
| *G06F 3/06* | (2006.01) | |
| *H04L 29/08* | (2006.01) | |
| *G06F 17/16* | (2006.01) | |

(52) U.S. Cl.
CPC ........ *G06F 3/0619* (2013.01); *G06F 9/30029* (2013.01); *G06F 11/1402* (2013.01); *G06F 17/16* (2013.01); *H03M 13/118* (2013.01); *H03M 13/154* (2013.01); *H04L 67/1097* (2013.01); *H03M 13/1515* (2013.01)

(58) Field of Classification Search
CPC .. G06F 11/1402; G06F 17/16; H03M 13/118; H03M 13/154; H03M 13/1515; H04L 67/1097
USPC ........................................................ 711/114
See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A * | 11/1999 | Lo Verso | G06F 11/1076 |
| | | | 714/6.1 |
| 5,991,414 A * | 11/1999 | Garay | H04L 9/302 |
| | | | 380/30 |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,700,809 B1 * | 3/2004 | Ng | G11C 15/00 |
| | | | 365/236 |
| 6,718,361 B1 * | 4/2004 | Basani | H04L 67/1095 |
| | | | 707/999.01 |
| 6,760,808 B2 * | 7/2004 | Peters | G06F 11/1076 |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 * | 7/2006 | Watson | G06F 17/30339 |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 * | 7/2007 | Cutts | G06F 11/1076 |
| | | | 714/6.1 |
| 7,272,613 B2 | 9/2007 | Sim et al. | |
| 7,430,647 B2 * | 9/2008 | Sandorfi | G06F 11/1448 |
| | | | 707/999.202 |
| 7,599,139 B1 * | 10/2009 | Bombet | G11B 5/09 |
| | | | 360/31 |
| 7,636,724 B2 | 12/2009 | de la Torre et al. | |
| 8,266,122 B1 * | 9/2012 | Newcombe | G06F 17/30309 |
| | | | 707/695 |
| 8,650,156 B1 * | 2/2014 | McHugh | G06F 17/30194 |
| | | | 707/638 |
| 8,694,855 B1 * | 4/2014 | Micheloni | G06F 11/1048 |
| | | | 714/704 |
| 8,849,825 B1 * | 9/2014 | McHugh | G06F 17/3033 |
| | | | 707/737 |
| 8,924,681 B1 * | 12/2014 | Throop | G06F 3/0631 |
| | | | 711/114 |
| 8,972,694 B1 * | 3/2015 | Dolan | G06F 13/28 |
| | | | 711/170 |
| 9,244,152 B1 * | 1/2016 | Thiagarajan | G01S 5/10 |
| 9,727,266 B2 * | 8/2017 | Resch | G06F 3/0625 |
| 9,841,925 B2 * | 12/2017 | Khadiwala | G06F 3/0659 |
| 9,916,114 B2 * | 3/2018 | Resch | G06F 3/065 |
| 9,921,907 B2 * | 3/2018 | Volvovski | G06F 11/10 |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 * | 5/2003 | Shu | G06F 11/1076 |
| 2003/0106005 A1 * | 6/2003 | Jue | G06F 17/5022 |
| | | | 714/741 |
| 2003/0163718 A1 * | 8/2003 | Johnson | G06F 12/1408 |
| | | | 713/193 |
| 2004/0024963 A1 | 2/2004 | Talagala et al. | |
| 2004/0122917 A1 * | 6/2004 | Menon | G06F 17/30194 |
| | | | 709/219 |
| 2004/0215998 A1 | 10/2004 | Buxton et al. | |
| 2004/0228493 A1 | 11/2004 | Ma | |
| 2005/0100022 A1 * | 5/2005 | Ramprashad | H04L 47/10 |
| | | | 370/395.42 |
| 2005/0108298 A1 * | 5/2005 | Iyengar | G06F 17/30215 |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0193084 A1 * | 9/2005 | Todd | G06F 3/0607 |
| | | | 709/214 |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 * | 10/2006 | Correll, Jr. | G06F 17/30545 |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 * | 7/2007 | Gladwin | G06F 21/6227 |
| | | | 705/40 |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2008/0082746 A1 * | 4/2008 | Nakamura | G06F 11/0727 |
| | | | 711/113 |
| 2008/0183975 A1 * | 7/2008 | Foster | G06F 11/1076 |
| | | | 711/153 |
| 2008/0243783 A1 * | 10/2008 | Santi | G06F 17/30241 |
| 2009/0089149 A1 * | 4/2009 | Lerner | G01C 21/32 |
| | | | 705/7.34 |
| 2009/0094251 A1 * | 4/2009 | Gladwin | G06F 17/30067 |

(56) References Cited

U.S. PATENT DOCUMENTS

| | | | | |
|---|---|---|---|---|
| 2009/0094318 A1* | 4/2009 | Gladwin | ............ | H04L 67/1097 709/203 |
| 2010/0023524 A1* | 1/2010 | Gladwin | ............ | G06F 3/0617 707/E17.032 |
| 2010/0169556 A1* | 7/2010 | Nakanishi | ............ | G06F 3/0643 711/103 |
| 2010/0306578 A1* | 12/2010 | Thornton | ............ | G06F 11/1076 714/6.12 |
| 2011/0029711 A1* | 2/2011 | Dhuse | ............ | G06F 11/1076 711/4 |
| 2011/0071988 A1* | 3/2011 | Resch | ............ | G06F 11/1076 707/691 |
| 2011/0072321 A1* | 3/2011 | Dhuse | ............ | G06F 11/1076 714/55 |
| 2011/0107113 A1* | 5/2011 | Resch | ............ | H04L 12/00 713/193 |
| 2011/0113065 A1* | 5/2011 | Cupka | ............ | G06F 17/30168 707/783 |
| 2011/0145486 A1* | 6/2011 | Owa | ............ | G06F 12/0246 711/103 |
| 2011/0161679 A1* | 6/2011 | Grube | ............ | G06F 11/1076 713/193 |
| 2011/0235434 A1* | 9/2011 | Byom | ............ | G11C 16/10 365/185.25 |
| 2011/0296219 A1* | 12/2011 | Okuda | ............ | G03G 15/5004 713/323 |
| 2011/0320709 A1* | 12/2011 | Han | ............ | G06F 3/061 711/114 |
| 2012/0054456 A1* | 3/2012 | Grube | ............ | G06F 3/0619 711/158 |
| 2012/0117351 A1* | 5/2012 | Motwani | ............ | G06F 3/0614 711/165 |
| 2012/0131584 A1* | 5/2012 | Raevsky | ............ | G06F 8/45 718/102 |
| 2012/0167108 A1* | 6/2012 | Bowers | ............ | G06F 9/5072 718/103 |
| 2012/0290868 A1* | 11/2012 | Gladwin | ............ | G06F 11/0727 714/4.1 |
| 2012/0290896 A1* | 11/2012 | Kong | ............ | H03M 13/152 714/763 |
| 2012/0311068 A1* | 12/2012 | Gladwin | ............ | H04L 65/602 709/214 |
| 2013/0013761 A1* | 1/2013 | Grube | ............ | H04L 65/4084 709/223 |
| 2013/0013960 A1* | 1/2013 | Gladwin | ............ | G06F 11/1084 714/6.3 |
| 2013/0073820 A1* | 3/2013 | Watanabe | ............ | G06F 3/0611 711/162 |
| 2013/0086450 A1* | 4/2013 | Grube | ............ | H03M 13/3761 714/763 |
| 2013/0108048 A1* | 5/2013 | Grube | ............ | H04W 12/00 380/270 |
| 2013/0205080 A1* | 8/2013 | Felton | ............ | G06F 21/79 711/105 |
| 2013/0227199 A1* | 8/2013 | Liu | ............ | G06F 12/0246 711/103 |
| 2013/0275545 A1* | 10/2013 | Baptist | ............ | H04L 29/08549 709/215 |
| 2013/0275656 A1* | 10/2013 | Talagala | ............ | G06F 12/0246 711/103 |
| 2013/0275744 A1* | 10/2013 | Resch | ............ | H04L 63/0428 713/150 |
| 2013/0275776 A1* | 10/2013 | Baptist | ............ | H04L 67/1097 713/193 |
| 2013/0282952 A1* | 10/2013 | Miyamae | ............ | G06F 12/0884 711/102 |
| 2013/0290703 A1* | 10/2013 | Resch | ............ | H04L 67/1097 713/155 |
| 2013/0326215 A1* | 12/2013 | Leggette | ............ | G06F 17/3023 713/156 |
| 2013/0326264 A1* | 12/2013 | Resch | ............ | G06F 11/1088 714/6.2 |
| 2013/0346708 A1* | 12/2013 | Nashimoto | ............ | G06F 3/061 711/162 |
| 2014/0019579 A1* | 1/2014 | Motwani | ............ | H04L 29/08549 709/216 |
| 2014/0149621 A1* | 5/2014 | Han | ............ | G06F 17/30362 710/200 |
| 2014/0177476 A1* | 6/2014 | Perrett | ............ | H04L 41/12 370/255 |
| 2014/0195846 A1* | 7/2014 | Resch | ............ | G06F 11/1092 714/6.22 |
| 2014/0298141 A1* | 10/2014 | Grube | ............ | G06F 9/4401 714/768 |
| 2015/0067421 A1* | 3/2015 | Baptist | ............ | H04L 67/1097 714/723 |
| 2015/0156204 A1* | 6/2015 | Resch | ............ | H04L 63/101 707/783 |
| 2015/0193309 A1* | 7/2015 | Khadiwala | ............ | G06F 11/1435 714/4.11 |
| 2015/0293720 A1* | 10/2015 | Lam | ............ | G06F 9/5016 711/147 |
| 2015/0339187 A1* | 11/2015 | Sharon | ............ | G11C 29/52 714/766 |
| 2015/0378616 A1* | 12/2015 | Khadiwala | ............ | G06F 3/0659 711/114 |
| 2015/0378626 A1* | 12/2015 | Motwani | ............ | G06F 3/067 711/114 |
| 2015/0378822 A1* | 12/2015 | Grube | ............ | G06F 11/1092 714/763 |
| 2015/0381730 A1* | 12/2015 | Resch | ............ | G06F 3/0616 709/225 |
| 2015/0381731 A1* | 12/2015 | Grube | ............ | H04L 67/1097 709/224 |
| 2016/0070719 A1* | 3/2016 | Resch | ............ | G06F 17/30557 707/827 |
| 2016/0124657 A1* | 5/2016 | Resch | ............ | G06F 3/065 711/114 |
| 2016/0139841 A1* | 5/2016 | Agetsuma | ............ | G06F 3/06 711/162 |
| 2016/0179618 A1* | 6/2016 | Resch | ............ | H04L 63/101 714/764 |
| 2016/0188253 A1* | 6/2016 | Resch | ............ | G06F 3/0647 711/172 |
| 2016/0226522 A1* | 8/2016 | Resch | ............ | H04L 67/1097 |
| 2016/0255150 A1* | 9/2016 | Dhuse | ............ | H04L 67/1097 709/213 |
| 2016/0292254 A1* | 10/2016 | Dhuse | ............ | G06F 17/30336 |
| 2016/0294949 A1* | 10/2016 | Motwani | ............ | H04L 67/1097 |
| 2016/0306699 A1* | 10/2016 | Resch | ............ | H04L 67/1097 |
| 2016/0342475 A1* | 11/2016 | Dhuse | ............ | G06F 11/076 |
| 2016/0378350 A1* | 12/2016 | Motwani | ............ | G06F 3/0607 711/154 |
| 2017/0147428 A1* | 5/2017 | Volvovski | ............ | G06F 11/10 |
| 2017/0168720 A1* | 6/2017 | Kazi | ............ | G06F 3/0604 |
| 2017/0168749 A1* | 6/2017 | Grube | ............ | G06F 3/0644 |
| 2017/0177228 A1* | 6/2017 | Baptist | ............ | G06F 3/0604 |
| 2017/0286223 A1* | 10/2017 | Baptist | ............ | G06F 11/1076 |
| 2018/0025776 A1* | 1/2018 | Achtenberg | ............ | G11C 11/5628 |
| 2018/0081586 A1* | 3/2018 | Kazi | ............ | G06F 3/0647 |
| 2018/0095826 A1* | 4/2018 | Wozniak | ............ | G06F 11/1076 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

(56) References Cited

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): Directory Information Models; IETF Network Working Group; RFC 4512; Jun. 2006; pp. 1-49.

* cited by examiner

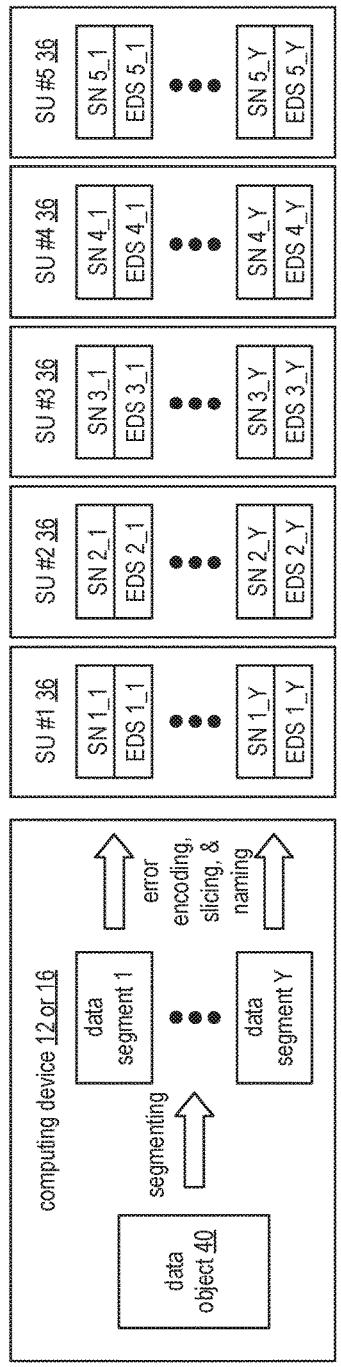
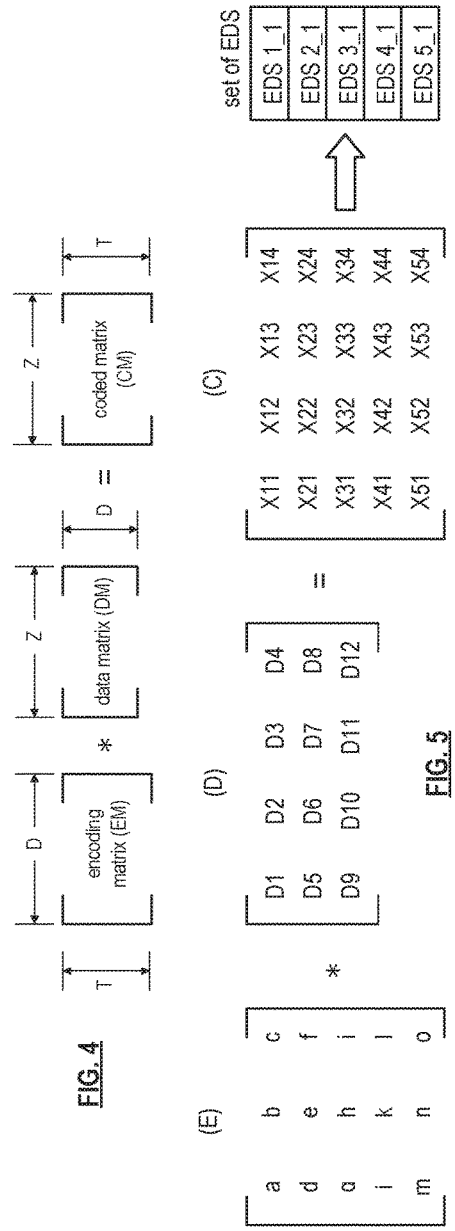

PARTIAL REBUILDING TECHNIQUES IN A DISPERSED STORAGE UNIT

CROSS-REFERENCE TO RELATED APPLICATIONS

The present U.S. Utility Patent Application claims priority pursuant to 35 U.S.C. § 120 as a continuation-in-part of U.S. Utility application Ser. No. 14/847,855, entitled "DETERMINISTICALLY SHARING A PLURALITY OF PROCESSING RESOURCES," filed Sep. 8, 2015, which claims priority pursuant to 35 U.S.C. § 119(e) to U.S. Provisional Application No. 62/072,123, entitled "ASSIGNING TASK EXECUTION RESOURCES IN A DISPERSED STORAGE NETWORK," filed Oct. 29, 2014, both of which are hereby incorporated herein by reference in their entirety and made part of the present U.S. Utility Patent Application for all purposes.

BACKGROUND

This invention relates generally to computer networks, and more specifically, to rebuilding data in a dispersed storage network.

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on a remote storage system. The remote storage system may include a RAID (redundant array of independent disks) system and/or a dispersed storage system that uses an error correction scheme to encode data for storage.

In a RAID system, a RAID controller adds parity data to the original data before storing it across an array of disks. The parity data is calculated from the original data such that the failure of a single disk typically will not result in the loss of the original data. While RAID systems can address certain memory device failures, these systems may suffer from effectiveness, efficiency and security issues. For instance, as more disks are added to the array, the probability of a disk failure rises, which may increase maintenance costs. When a disk fails, for example, it needs to be manually replaced before another disk(s) fails and the data stored in the RAID system is lost. To reduce the risk of data loss, data on a RAID device is often copied to one or more other RAID devices. While this may reduce the possibility of data loss, it also raises security issues since multiple copies of data may be available, thereby increasing the chances of unauthorized access. In addition, co-location of some RAID devices may result in a risk of a complete data loss in the event of a natural disaster, fire, power surge/outage, etc.

SUMMARY

According to embodiments of the present disclosure, novel methods are presented for use in a dispersed storage network (DSN) to rebuild data. In various examples, a data object for storage in a set of storage units of the DSN is segmented into data segments, at least one of which is dispersed storage error encoded to produce a set of encoded data slices that includes an information dispersal algorithm (IDA) width number of encoded data slices, wherein the IDA width number is at least twice the number of storage units in the set of storage units. The set of encoded data slices is stored in the set of storage units, where at least two encoded data slices of the set of encoded data slices are stored in each of the storage units of the set of storage units. After detecting a storage error indicating that an encoded data slice of the set of encoded data slices is an error slice, a request is made for a partial threshold number of partial encoded data slices for select encoded data slices of the set of encoded data slices. In response, the storage units of the set of storage units perform a partial encoding function on locally stored encoded data slices of the select encoded data slices to produce a group of partial encoded data slices. The storage units combine respective groups of partial encoded data slices to produce respective partial encoded data slice responses. The partial threshold number of partial encoded data slice responses are combined to produce a rebuilt encoded data slice corresponding to the error slice, and the rebuilt encoded data slice is stored in the set of storage units.

BRIEF DESCRIPTION OF THE DRAWINGS

FIG. 3 is a schematic block diagram of an example of dispersed storage error encoding of data in accordance with the present disclosure;

FIG. 4 is a schematic block diagram of a generic example of an error encoding function in accordance with the present disclosure;

FIG. 5 is a schematic block diagram of a specific example of an error encoding function in accordance with the present disclosure;

FIG. 6 is a schematic block diagram of an example of slice naming information for an encoded data slice (EDS) in accordance with the present disclosure;

DETAILED DESCRIPTION

Figure 1:
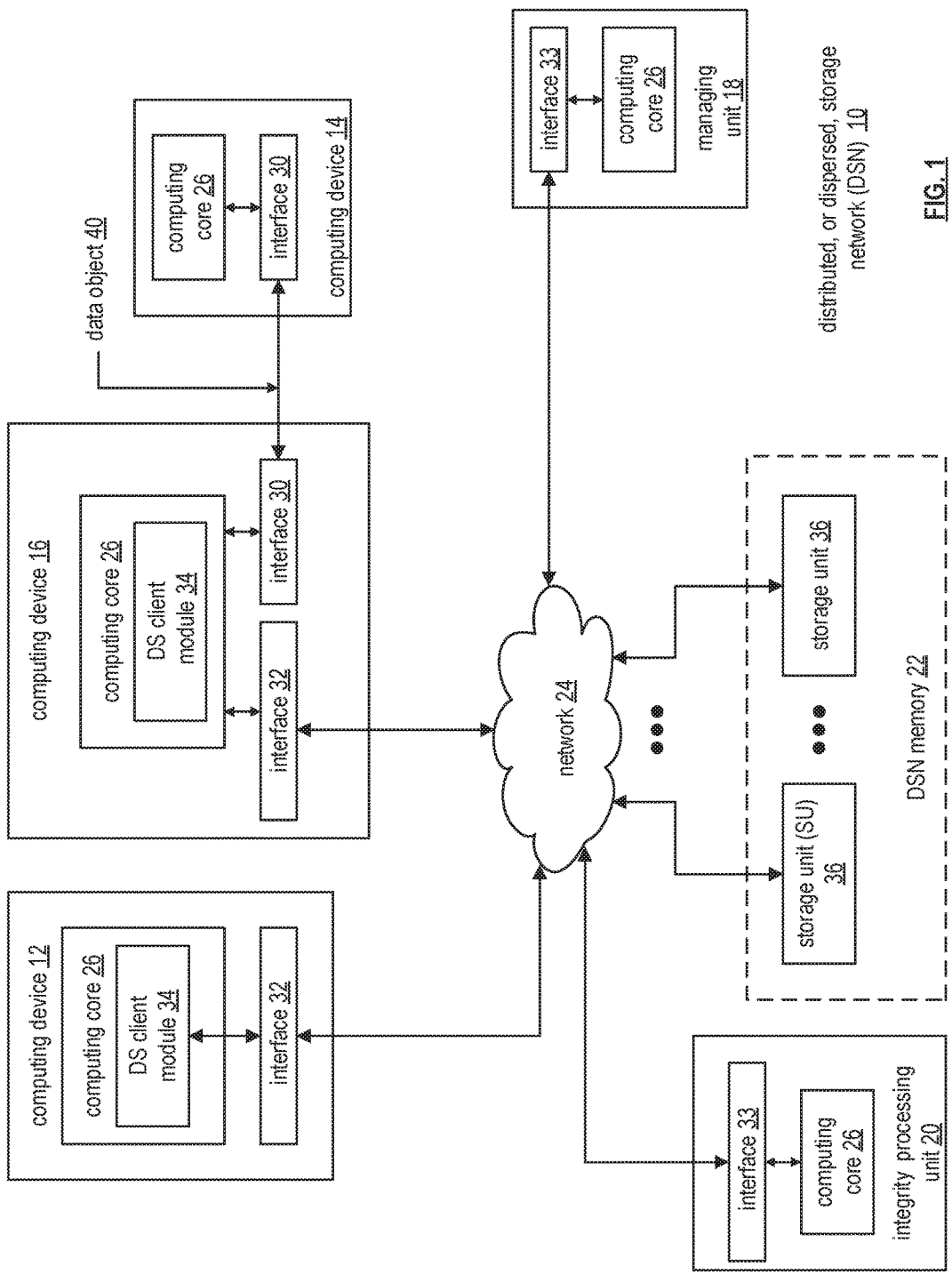
FIG. 1 is a schematic block diagram of an embodiment of a dispersed or distributed storage network (DSN) in accordance with the present disclosure.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
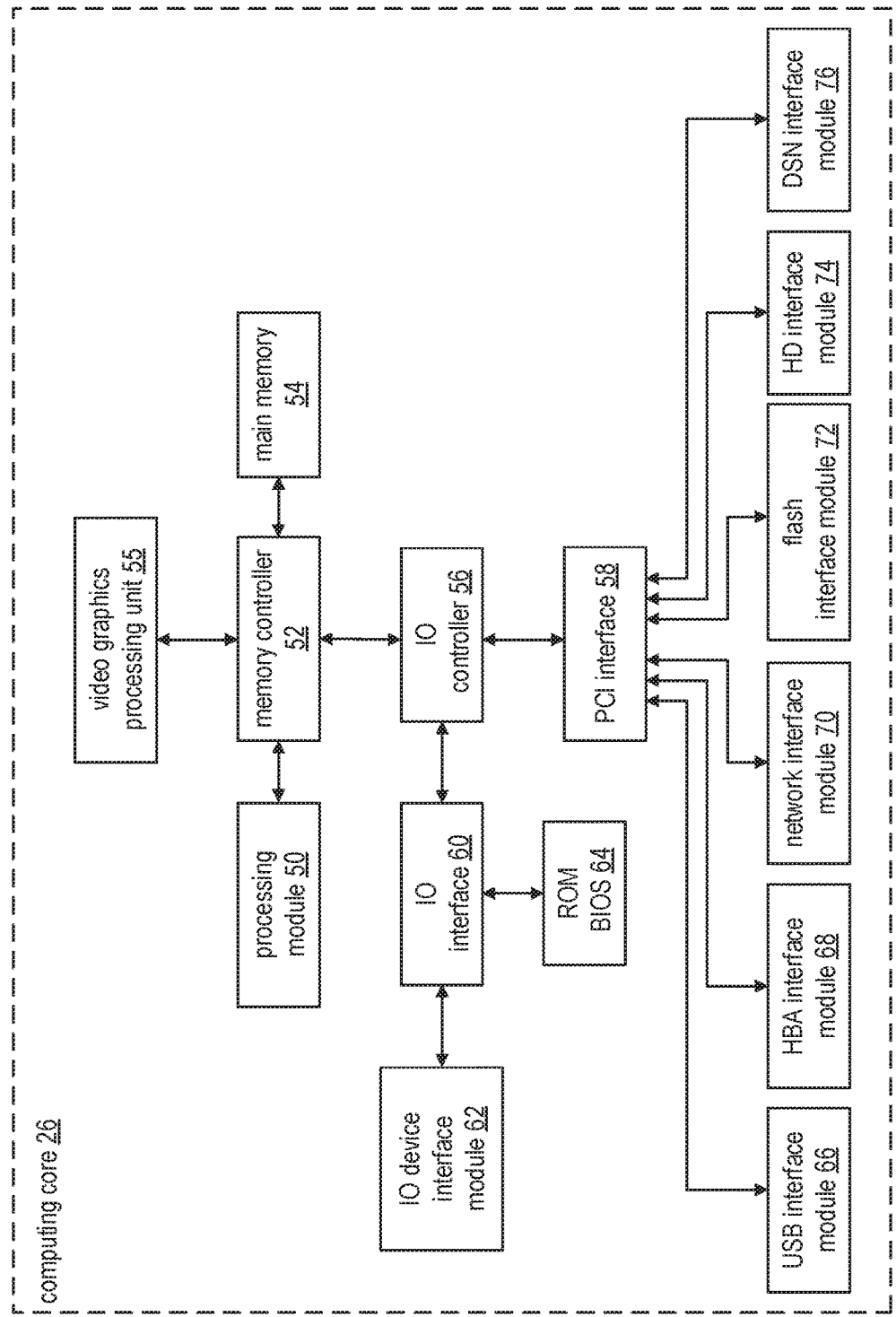
FIG. 2 is a schematic block diagram of an embodiment of a computing core in accordance with the present disclosure.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more than or less than eight storage units 36. Further note that each storage unit 36 includes a computing core (as shown in FIG. 2, or components thereof) and a plurality of memory devices for storing dispersed storage (DS) error encoded data.

Each of the storage units 36 is operable to store DS error encoded data and/or to execute (e.g., in a distributed manner) maintenance tasks and/or data-related tasks. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, maintenance tasks (e.g., rebuilding of data slices, updating hardware, rebooting software, restarting a particular software process, performing an upgrade, installing a software patch, loading a new software revision, performing an off-line test, prioritizing tasks associated with an online test, etc.), etc.

Each of the computing devices 12-16, the managing unit 18, integrity processing unit 20 and (in various embodiments) the storage units 36 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data object 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate per-access billing information. In another instance, the managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation/access requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10. Examples of data rebuilding operations are discussed in greater detail below with reference to FIGS. 9-11.

To support data storage integrity verification within the DSN 10, the integrity processing unit 20 (and/or other devices in the DSN 10) may perform rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. Retrieved encoded slices are checked for errors due to data corruption, outdated versioning, etc. If a slice includes an error, it is flagged as a 'bad' or 'corrupt' slice. Encoded data slices that are not received and/or not listed may be flagged as missing slices. Bad and/or missing slices may be subsequently rebuilt using other retrieved encoded data slices that are deemed to be good slices in order to produce rebuilt slices. A multi-stage decoding process may be employed in certain circumstances to recover data even when the number of valid encoded data slices of a set of encoded data slices is less than a relevant decode threshold number. The rebuilt slices may then be written to DSN memory 22. Note that the integrity processing unit 20 may be a separate unit as shown, included in DSN memory 22, included in the computing device 16, and/or distributed among the storage units 36.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of five, a decode threshold of three, a read threshold of four, and a write threshold of four. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number. In the illustrated example, the value X11=aD1+bD5+cD9, X12=aD2+bD6+cD10, . . . X53=mD3+nD7+oD11, and X54=mD4+nD8+oD12.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as at least part of a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
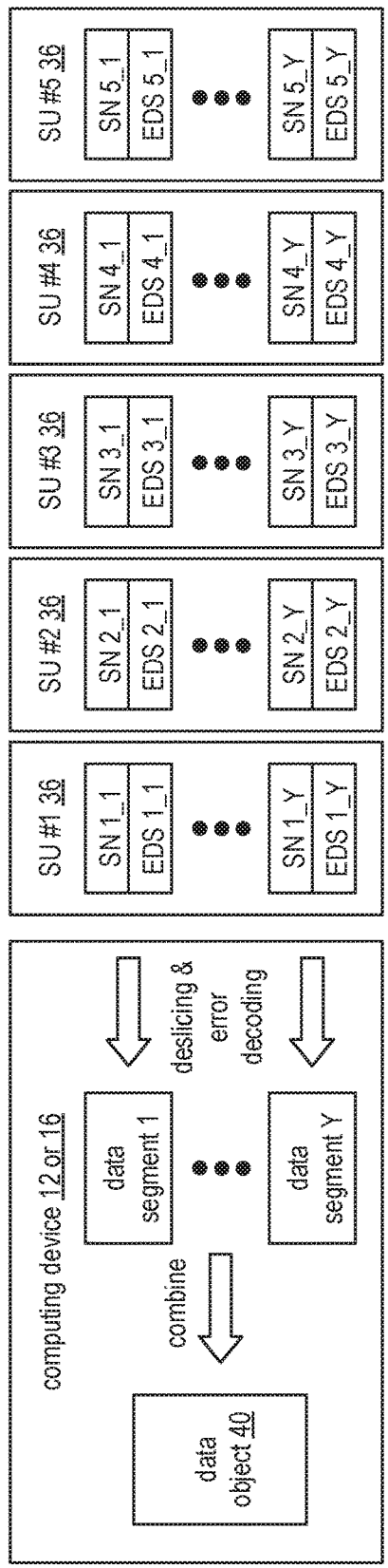
FIG. 7 is a schematic block diagram of an example of dispersed storage error decoding of data in accordance with the present disclosure.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
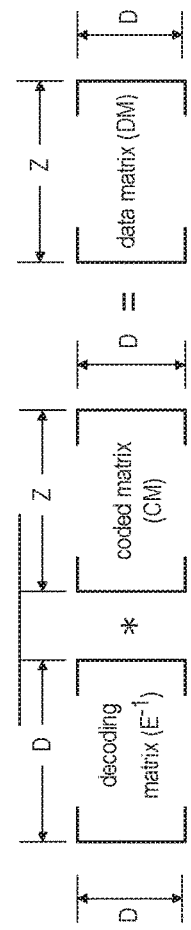
FIG. 8 is a schematic block diagram of a generic example of an error decoding function in accordance with the present disclosure.

In order to recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

As described more fully below in conjunction with the novel examples of FIGS. 9-11, novel partial data rebuilding methodologies are utilized to recover missing or corrupted encoded data slices. The partial data rebuilding may combine partially computed slices prior to transmission over a network for use in further data rebuilding operations, thereby reducing the amount of data traffic communicated over the network.

Figure 9:
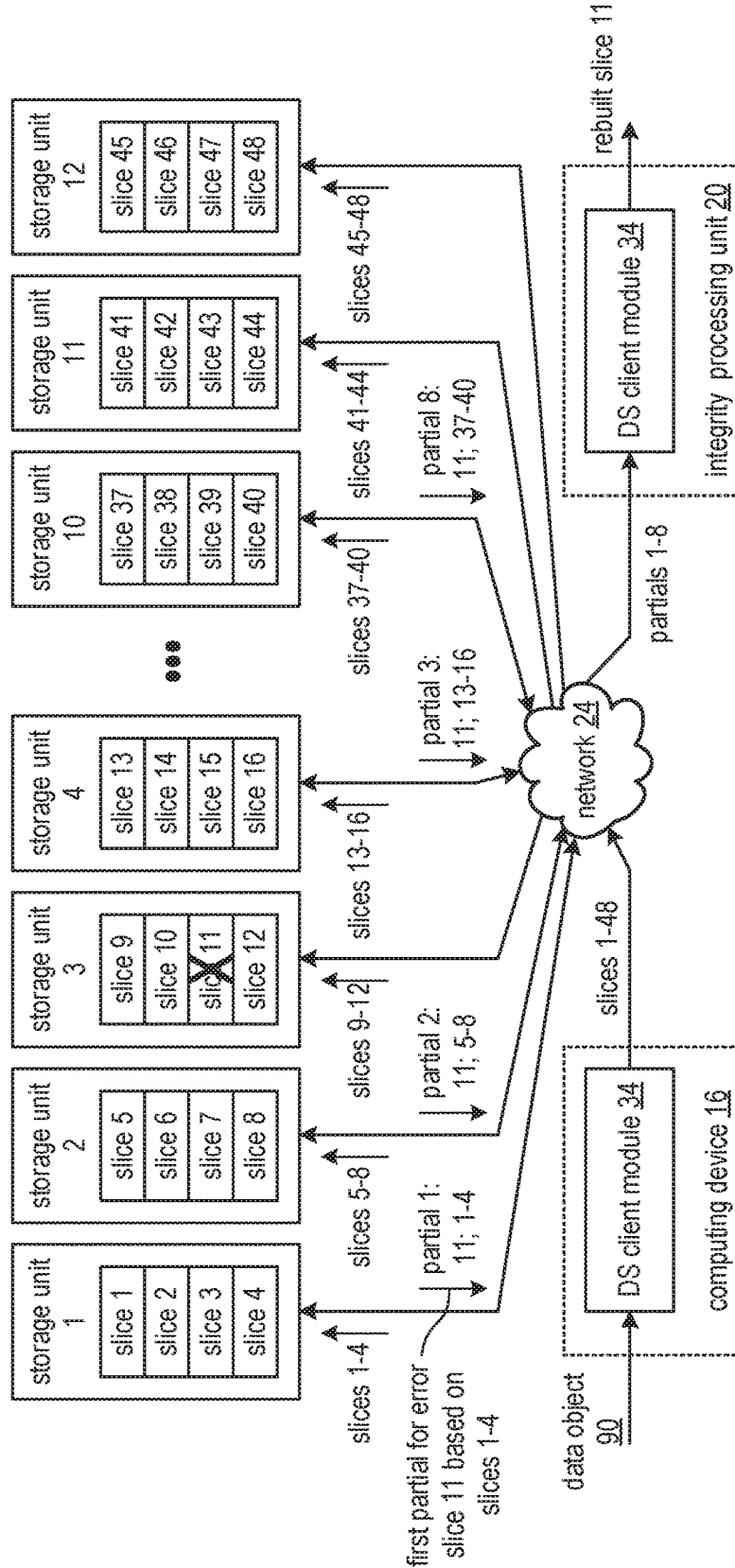
FIG. 9 is a schematic block diagram of an example of a DSN performing data rebuilding operations in accordance with an embodiment of the present disclosure.

Referring now to FIG. 9, a schematic block diagram of a dispersed storage network (DSN) performing data rebuilding operations in accordance with the present disclosure is illustrated. The DSN of this example includes a set of storage units 1-12, the network 24 of FIG. 1, the computing device 16 of FIG. 1, and the integrity processing unit 20 of FIG. 1. The computing device 16 includes the DS client module 34 of FIG. 1, and the integrity processing unit 20 includes a DS client module 34 of FIG. 1. Each storage unit may be implemented utilizing the storage unit 36 of FIG. 1, and include a DS client module 34 and a processing module (not separately illustrated). The storage units 1-12 may be located at a same physical location (site) or located at multiple physical locations without departing from the technology as described herein.

In general, the set of storage units 1-12 stores a plurality of dispersed storage (DS) error encoded data. The DS error encoded data may be encoded in accordance with one or more examples described with reference to FIGS. 3-6, and organized (for example) in slice groupings or pillar groups. The data that is encoded into the DS error encoded data may be of any size and/or of any content. For example, the data may be one or more digital books, a copy of a company's emails, a large-scale Internet search, a video security file, one or more entertainment video files (e.g., television programs, movies, etc.), data files, and/or indexing and key information for use in dispersed storage operations.

The illustrated DSN is operable to rebuild stored data when a storage error associated with an error slice (e.g., an encoded data slice that is unreliable, corrupted or otherwise unavailable) has been detected. In an example of operation of the rebuilding of the stored data, the computing device 16 divides a data object 90 into a plurality of data segments, dispersed storage error encodes each data segment to produce a set of encoded data slices that includes an information dispersal algorithm (IDA) width number of encoded data slices, where the IDA width is at least twice a number of storage units of the set of storage units. As such, two or more encoded data slices of each set of encoded data slices are stored in each storage unit of the set of storage units. For example, 4 encoded data slices are stored, via the network 24, in each of the set of storage units 1-12 when the IDA width is 48. Having generated the encoded data slices, the computing device facilitates storage of each set of encoded data slices in the set of storage units, where at least two encoded data slices are stored in each storage unit (e.g., stored in one or more memories within each storage unit).

When detecting the storage error indicating an error slice, the integrity processing unit 20 requests, via the network 24, a partial threshold number of partial encoded data slices for selected slices of the set of encoded data slices that includes the error slice (e.g., encoded data slice to be rebuilt). For example, the integrity processing unit 20 requests eight partial encoded data slices from eight storage units, where the eight partial encoded data slices are based on thirty-two stored encoded data slices of the set of forty-eight encoded data slices when the decode threshold number is thirty-two, and when detecting that the encoded data slice 11 is the error slice. As such, each of the partial encoded data slices is based on four encoded data slices stored within a particular storage unit.

Each storage unit receiving a partial encoded data slice request performs a partial encoding function on each available encoded data slice of the selected slices of the set of encoded data slices within the storage unit to produce one of the partial encoded data slices of the requested partial threshold number of partial encoded data slices. For example, the storage unit 1 obtains an encoding matrix utilized to generate the encoded data slice 11 to be rebuilt, reduces the encoding matrix to produce a square matrix that exclusively includes rows associated with the decode threshold number of selected slices, inverts the square matrix to produce an inverted matrix, matrix multiplies the inverted matrix by an encoded data slice associated with the storage unit to produce a vector, and matrix multiplies the vector by a row of the encoding matrix corresponding to the encoded data slice 11 to be rebuilt to produce the partial encoded data slice for the selected slice.

Having produced the partial encoded data slices for the selected slices, each storage unit that receives the partial encoded data slice request combines the partial encoded data slices of the storage unit to produce a single partial encoded data slice response for transmission, via the network 24, to the integrity processing unit 20. For example, the storage unit 1 adds the partial encoded data slices in the field under which the IDA arithmetic is implemented (e.g., exclusive OR) to produce partial encoded data slice 1, for error slice 11, based on encoded data slices 1-4. Having produced the single partial encoded data slice response, the storage units send, via the network 24, respective single partial encoded data slice responses to the integrity processing unit 20.

The integrity processing unit 20 receives the partial threshold number of partial encoded data slices 1-8 and combines the received partial encoded data slices to produce a rebuilt encoded data slice for the error slice. For example, the integrity processing unit 20 adds the received partial encoded data slices 1-8 in the field under which the IDA arithmetic is implemented. Having produced the rebuilt encoded data slice 11, the integrity processing unit 20 facilitates overwriting (or replacement) of the error slice with the rebuilt encoded data slice. For example, the integrity processing unit 20 issues, via the network 24, a write slice request to storage unit 3, where the write slice request includes the rebuilt encoded data slice for error slice 11.

Figure 10:
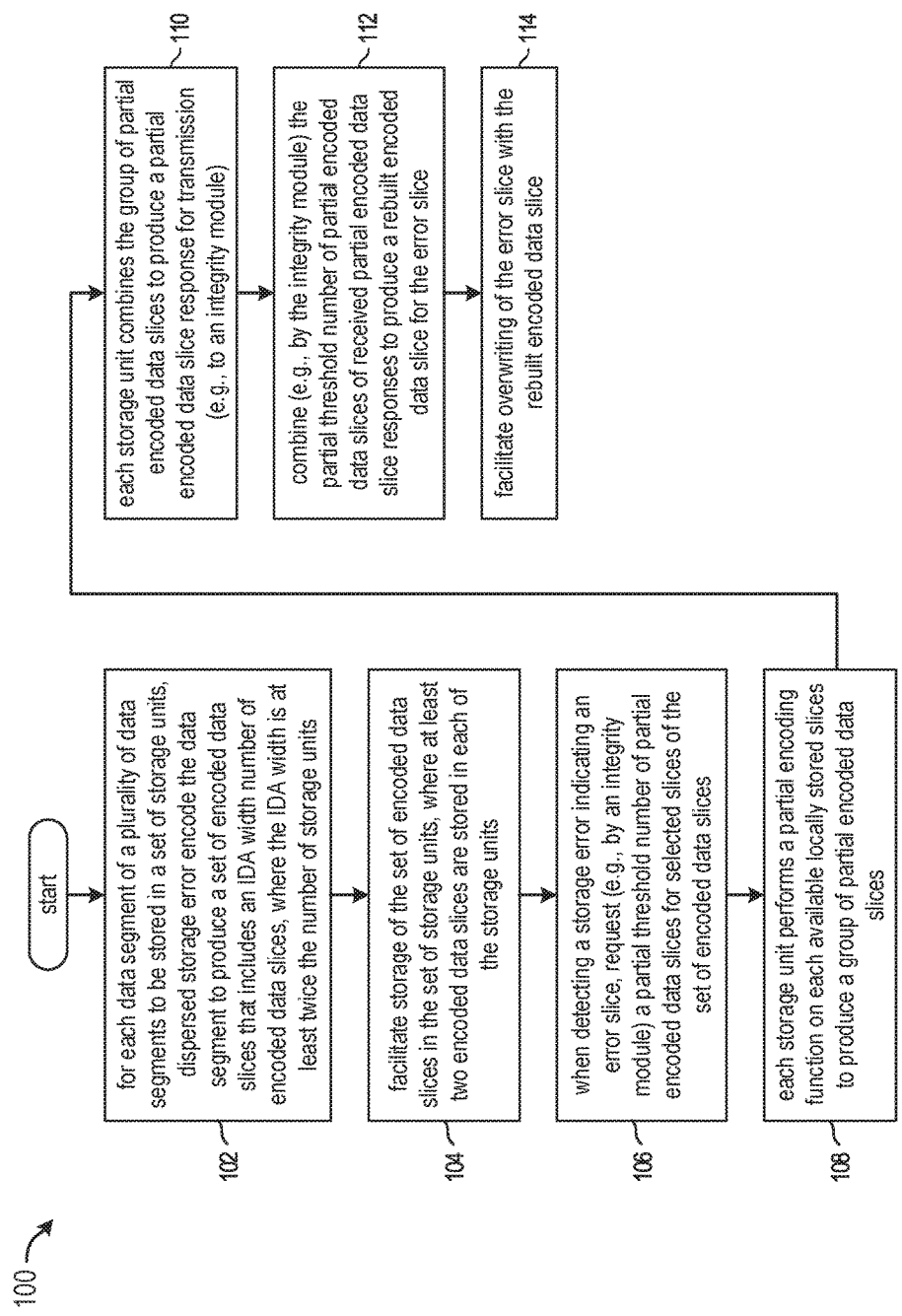
FIG. 10 is a flow diagram illustrating an example of rebuilding stored data in accordance with the present disclosure.

FIG. 10 is a flowchart 100 illustrating an example of rebuilding stored data in accordance with an embodiment of the present disclosure. The method begins or continues at step 102 where a processing module (e.g., of a distributed storage (DS) client module), for each data segment of a plurality of data segments to be stored in a set of storage units, dispersed storage error encodes the data segment to produce a set of encoded data slices that includes an information dispersal algorithm (IDA) width number of encoded data slices, where the IDA width is at least twice the number of storage units.

The method continues at step 104 where the processing module facilitates storage of the set of encoded data slices in the set of storage units, where at least two encoded data slices are stored in each of the storage units. For example, the processing module issues write slice requests to the storage units, where the storage units store the encoded data slices in one or more memories.

When detecting a storage error indicating an error slice, the method continues at step 106 where an integrity module (e.g., of integrity processing unit 20) requests a partial threshold number of partial encoded data slices for selected slices of the set of encoded data slices. Detecting a storage error indicating an error slice may include one or more of interpreting an error message, scanning encoded data slices, or detecting the error when an encoded data slice is missing or corrupted. Requesting a partial threshold number of partial encoded data slices can include issuing partial slice requests indicating the identity of the error slice and selected slices of the rebuilding process. The partial slice request may further include a rebuilding matrix.

The method continues at step 108 where each storage unit performs a partial encoding function on each available locally stored slice to produce a group of partial encoded data slices. The partial encoding function can be based on the slice to be rebuilt, the rebuilding matrix, and one or more locally stored slices. The rebuilding matrix is based on the selected slices for the rebuilding process (e.g., includes rows of an encoding matrix associated with the selected slices for the rebuilding process, where the selected slices includes a decode threshold number of slices).

Figure 11:
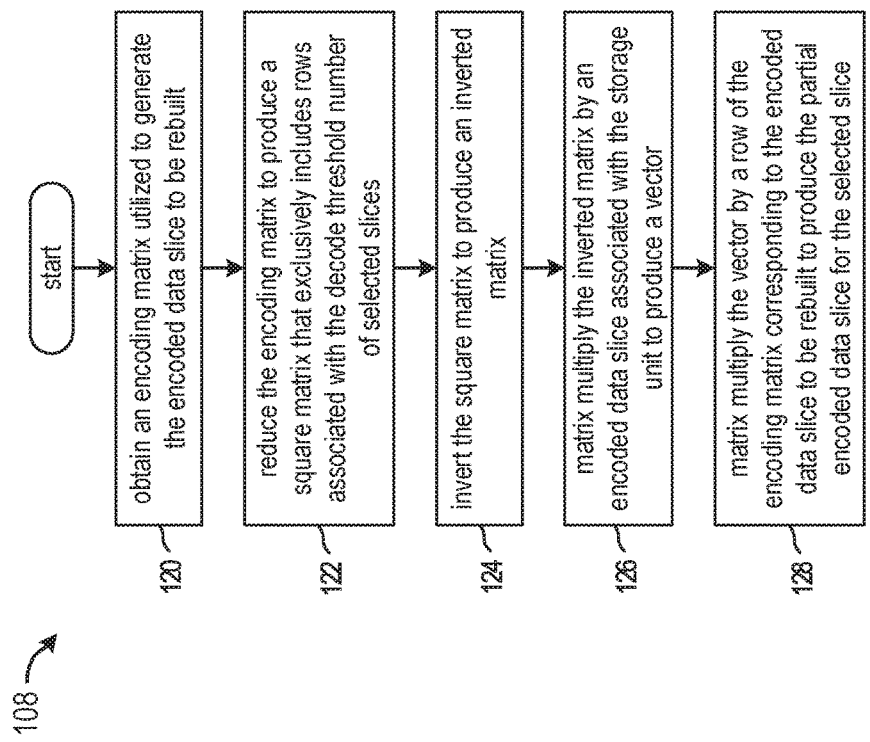
FIG. 11 is a flow diagram illustrating an example of producing a partial encoded data slice in accordance with the present disclosure.

For example, and with reference to FIG. 11, a storage unit obtains an encoding matrix utilized to generate the encoded data slice to be rebuilt (step 120), and reduces the encoding matrix (step 122) to produce a square matrix that exclusively includes rows associated with the decode threshold number of selected slices. Next, at step 124, the storage unit inverts the square matrix to produce an inverted matrix. The method continues at step 126 where the storage unit matrix multiplies the inverted matrix by an encoded data slice associated with the storage unit to produce a vector, and matrix multiplies (step 128) the vector by a row of the encoding matrix corresponding to the encoded data slice for the selected slice.

Referring again to FIG. 10, the method continues at step 110 where each storage unit combines the group of partial encoded data slices to produce a partial encoded data slice response for transmission to the integrity module. For example, the storage unit adds the partial encoded data slices in a field under which the IDA arithmetic was implemented.

The method continues at step 112 where the integrity module combines the partial threshold number of partial encoded data slices of received partial encoded data slice responses to produce a rebuilt encoded data slice for the error slice. For example, the integrity module adds the received partial encoded data slices in the field under which the IDA arithmetic was implemented. The method continues at step 114 where the integrity module facilitates overwriting of the error slice with the rebuilt encoded data slice. For example, the integrity module issues a write slice request to a storage unit associated with the error slice, where the write slice request includes the rebuilt encoded data slice.

The methods described above in conjunction with the computing device 16, integrity processing unit 20, and storage units 36 can alternatively be performed by other modules (e.g., DS client modules 34) of a dispersed storage network or by other devices (e.g., managing unit 18). Any combination of a first module, a second module, a third module, a fourth module, etc. of the computing devices and the storage units may perform the method described above. In addition, at least one memory section (e.g., a first memory section, a second memory section, a third memory section, a fourth memory section, a fifth memory section, a sixth memory section, etc. of a non-transitory computer readable storage medium) that stores operational instructions/program instructions can, when executed by one or more processing modules of one or more computing devices and/or by the storage units of the dispersed storage network (DSN), cause the one or more computing devices and/or the storage units to perform any or all of the method steps described above.

As may be used herein, the terms "substantially" and "approximately" provide an industry-accepted tolerance for its corresponding term and/or relativity between items. Such an industry-accepted tolerance ranges from less than one percent to fifty percent. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained. For example, two blocks shown in succession may, in fact, be executed substantially concurrently, or the blocks may sometimes be executed in the reverse order, depending upon the functionality involved. It will also be noted that each block of the block diagrams and/or flow diagrams, and combinations of blocks in the block diagrams and/or flow diagrams, can be implemented by special purpose hardware-based systems that perform the specified functions or acts or carry out combinations of special purpose hardware and computer instructions.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from Figure to Figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be one or more tangible devices that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the method comprises:

receiving a data object for storage in a set of storage units of the DSN;

dispersed storage error encoding at least one data segment of the data object to produce a set of encoded data slices that includes an information dispersal algorithm (IDA) width number of encoded data slices, wherein the IDA width number is at least twice the number of storage units in the set of storage units;

facilitating storage of the set of encoded data slices in the set of storage units, where at least two encoded data slices of the set of encoded data slices are stored in each of the storage units of the set of storage units;

detecting a storage error indicating that an encoded data slice of the set of encoded data slices is an error slice;

requesting, in response to the storage error, a partial threshold number of partial encoded data slices for select encoded data slices of the set of encoded data slices;

performing, by storage units of the set of storage units receiving a request for a partial encoded data slice, a partial encoding function on locally stored encoded data slices of the select encoded data slices to produce a group of partial encoded data slices;

combining, by each of the storage units receiving the request for a partial encoded data slice, a respective group of partial encoded data slices to produce respective partial encoded data slice responses;

receiving a partial threshold number of partial encoded data slice responses;

combining the partial threshold number of partial encoded data slice responses to produce a rebuilt encoded data slice corresponding to the error slice; and facilitating storage of the rebuilt encoded data slice in the set of storage units.

2. The method of claim 1, wherein a partial encoded data slice for a select encoded data slice is generated by:

determining an encoding matrix utilized to generate the encoded data slice to be rebuilt;

reducing the encoding matrix to produce a square matrix, the square matrix including rows associated with at least a decode threshold number of select encoded data slices;

inverting the square matrix to produce an inverted matrix;

matrix multiplying the inverted matrix by an encoded data slice to produce a vector; and matrix multiplying the vector by a row of the encoding matrix corresponding to the encoded data slice to be rebuilt to produce the partial encoded data slice for the select encoded data slice.

3. The method of claim 1, wherein combining a respective group of partial encoded data slices to produce a respective partial encoded data slice response includes performing an exclusive OR operation on the respective group of partial encoded data slices.

4. The method of claim 1, wherein detecting a storage error includes one or more of interpreting an error message, scanning encoded data slices, or detecting a missing or corrupted encoded data slice.

5. The method of claim 1, wherein requesting a partial threshold number of partial encoded data slices includes issuing, for receipt by storage units of the set of storage units, partial slice requests indicating the identity of the error slice and select slices for a rebuilding process.

6. The method of claim 5, wherein the partial slice requests further include a rebuilding matrix.

7. The method of claim 1, wherein facilitating storage of the rebuilt encoded data slice includes issuing a write slice request to a storage unit associated with the error slice, where the write slice request includes the rebuilt encoded data slice.

8. The method of claim 1, wherein facilitating storage of the set of encoded data slices in the set of storage units includes issuing write slice requests to the storage units of the set of storage units.

9. The method of claim 1, wherein combining the partial threshold number of partial encoded data slice responses to produce a rebuilt encoded data slice corresponding to the error slice includes performing an exclusive OR operation on the partial threshold number of partial encoded data slice responses.

10. A computer readable storage medium comprises:

at least one memory section that stores operational instructions that, when executed by one or more processing modules of a dispersed storage network (DSN) that include a processor and a memory, causes the one or more processing modules to:

receive a data object for storage in a set of storage units of the DSN;

dispersed storage error encode at least one data segment of the data object to produce a set of encoded data slices that includes an information dispersal algorithm (IDA) width number of encoded data slices, wherein the IDA width number is at least twice the number of storage units in the set of storage units;

facilitate storage of the set of encoded data slices in the set of storage units, where at least two encoded data slices of the set of encoded data slices are stored in each of the storage units of the set of storage units;

detect a storage error indicating that an encoded data slice of the set of encoded data slices is an error slice;

request, in response to the storage error, a partial threshold number of partial encoded data slices for select encoded data slices of the set of encoded data slices;

perform a partial encoding function on locally stored encoded data slices of the select encoded data slices to produce a group of partial encoded data slices;

combine a respective group of partial encoded data slices to produce respective partial encoded data slice responses;

receive a partial threshold number of partial encoded data slice responses;

combine the partial threshold number of partial encoded data slice responses to produce a rebuilt encoded data slice corresponding to the error slice; and facilitate storage of the rebuilt encoded data slice in the set of storage units.

11. The computer readable storage medium of claim 10, wherein the at least one memory section stores further operational instructions that, when executed by the one or more processing modules to generate a partial encoded data slice for a select encoded data slice, causes the one or more processing modules to:

determine an encoding matrix utilized to generate the encoded data slice to be rebuilt;

reduce the encoding matrix to produce a square matrix, the square matrix including rows associated with at least a decode threshold number of select encoded data slices;

invert the square matrix to produce an inverted matrix;

matrix multiply the inverted matrix by an encoded data slice to produce a vector; and matrix multiply the vector by a row of the encoding matrix corresponding to the encoded data slice to be rebuilt to produce the partial encoded data slice for the select encoded data slice.

12. The computer readable storage medium of claim 10, wherein combining a respective group of partial encoded data slices to produce a respective partial encoded data slice response includes performing an exclusive OR operation on the respective group of partial encoded data slices.

13. The computer readable storage medium of claim 10, wherein detecting a storage error includes one or more of interpreting an error message, scanning encoded data slices, or detecting a missing or corrupted encoded data slice.

14. The computer readable storage medium of claim 10, wherein requesting a partial threshold number of partial encoded data slices includes issuing, for receipt by storage units of the set of storage units, partial slice requests indicating the identity of the error slice and select encoded slices for a rebuilding process.

15. The computer readable storage medium of claim 14, wherein the partial slice requests further include a rebuilding matrix.

16. The computer readable storage medium of claim 10, wherein combining the partial threshold number of partial encoded data slice responses to produce a rebuilt encoded data slice corresponding to the error slice includes performing an exclusive OR operation on the partial threshold number of partial encoded data slice responses.

17. A computing device of a dispersed storage network (DSN), the computing device comprises:
  a network interface;
  a memory comprising instructions; and
  one or more processing modules in communication with the memory, wherein the one or more processing modules execute the instructions to:
    receive a data object for storage in a set of storage units of the DSN;
    dispersed storage error encode at least one data segment of the data object to produce a set of encoded data slices that includes an information dispersal algorithm (IDA) width number of encoded data slices, wherein the IDA width number is at least twice the number of storage units in the set of storage units;
    facilitate storage of the set of encoded data slices in the set of storage units, where at least two encoded data slices of the set of encoded data slices are stored in each of the storage units of the set of storage units;
    detect a storage error indicating that an encoded data slice of the set of encoded data slices is an error slice;
    request, in response to the storage error, a partial threshold number of partial encoded data slices for select encoded data slices of the set of encoded data slices, wherein a partial encoded data slice is generated by combining a plurality of slices generated by a partial encoding function;
    receive, via the network interface, a partial threshold number of partial encoded data slice responses;
    combine the partial threshold number of partial encoded data slice responses to produce a rebuilt encoded data slice corresponding to the error slice; and
    facilitate, via the network interface, storage of the rebuilt encoded data slice in the set of storage units.

18. The computing device of claim 17, wherein the partial encoding function includes:
  determining an encoding matrix utilized to generate the encoded data slice to be rebuilt;
  reducing the encoding matrix to produce a square matrix, the square matrix including rows associated with at least a decode threshold number of select slices;
  inverting the square matrix to produce an inverted matrix;
  matrix multiplying the inverted matrix by a select encoded data slice to produce a vector; and
  matrix multiplying the vector by a row of the encoding matrix corresponding to the encoded data slice to be rebuilt to produce the partial encoded data slice for the select encoded data slice.

19. The computing device of claim 17, wherein combining a plurality of slices includes performing an exclusive OR operation on the plurality of slices.

20. The computing device of claim 17, wherein combining the partial threshold number of partial encoded data slice responses to produce a rebuilt encoded data slice corresponding to the error slice includes performing an exclusive OR operation on the partial threshold number of partial encoded data slice responses.

* * * * *